(12) United States Patent
Fiedler et al.

(10) Patent No.: US 6,417,790 B1
(45) Date of Patent: Jul. 9, 2002

(54) LOW-POWER DATA SERIALIZER

(75) Inventors: Alan S. Fiedler, Bloomington; Brett D. Hardy, Edina, both of MN (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/782,806

(22) Filed: Feb. 14, 2001

Related U.S. Application Data
(60) Provisional application No. 60/236,415, filed on Sep. 28, 2000.

(51) Int. Cl.[7] .................. H03M 9/00; H03K 19/096
(52) U.S. Cl. ..................... 341/101; 326/96; 326/93; 326/298
(58) Field of Search ................. 341/101, 100; 326/93, 98, 104, 105, 26, 27, 298, 96, 106; 708/272

(56) References Cited

U.S. PATENT DOCUMENTS

| | | | | |
|---|---|---|---|---|
| 5,955,897 A | * | 9/1999 | Narayana et al. | 341/105 |
| 6,087,855 A | * | 7/2000 | Frederick, Jr. et al. | 326/106 |
| 6,268,746 B1 | * | 7/2001 | Potter et al. | 326/93 |
| 6,271,682 B1 | * | 8/2001 | Lindsay | 326/93 |

* cited by examiner

Primary Examiner—Peguy Jeanpierre
Assistant Examiner—Jean Bruner Jeanglaude
(74) Attorney, Agent, or Firm—Westman, Champlin & Kelly

(57) ABSTRACT

A data serializer includes a differential output stage. The differential output stage has n pairs of first and second control inputs, wherein each pair of control inputs corresponds to one of n data inputs. Each pair of first and second control inputs is driven by first and second logic AND circuits having p-channel output drive transistors.

16 Claims, 2 Drawing Sheets

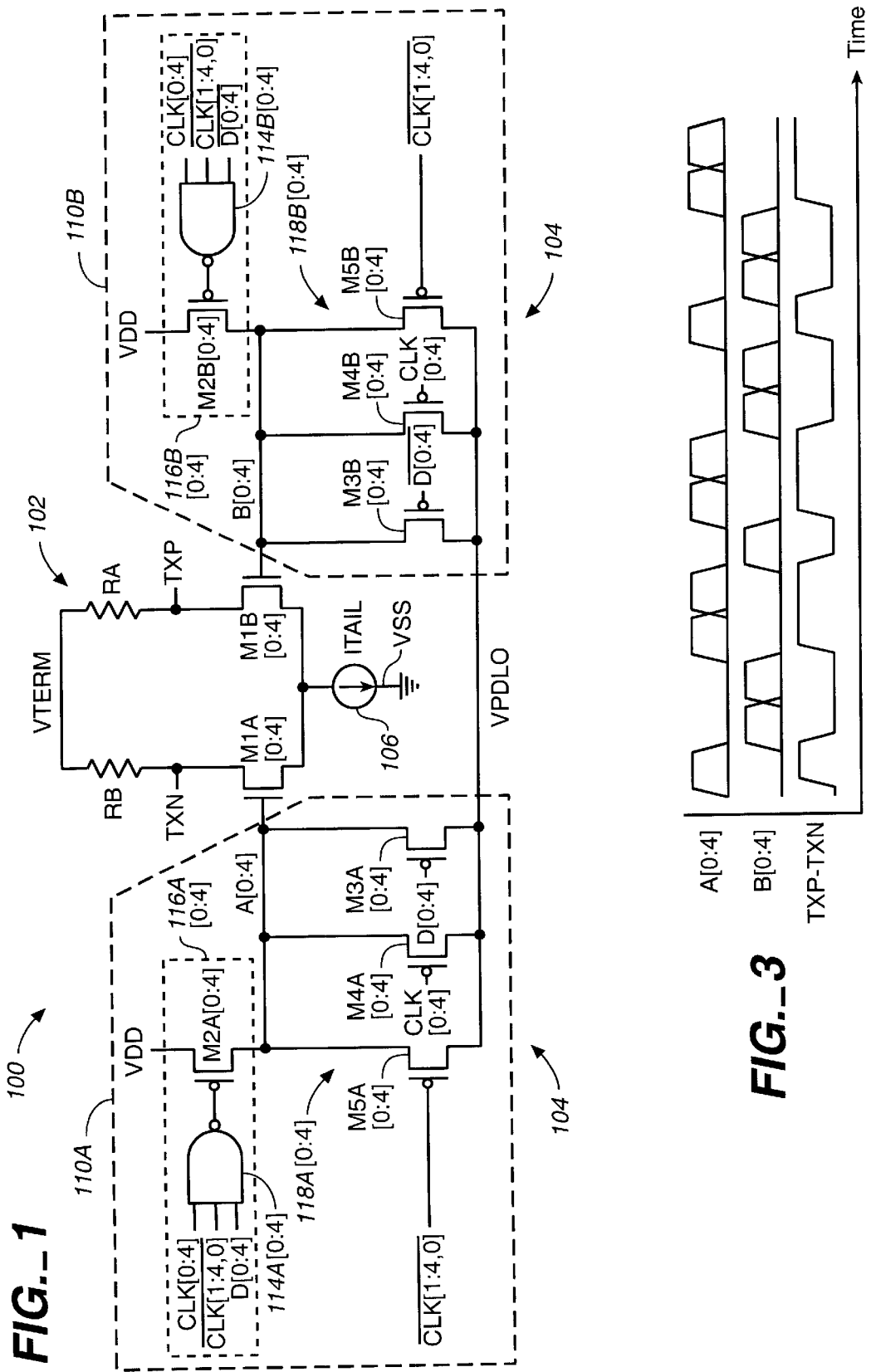

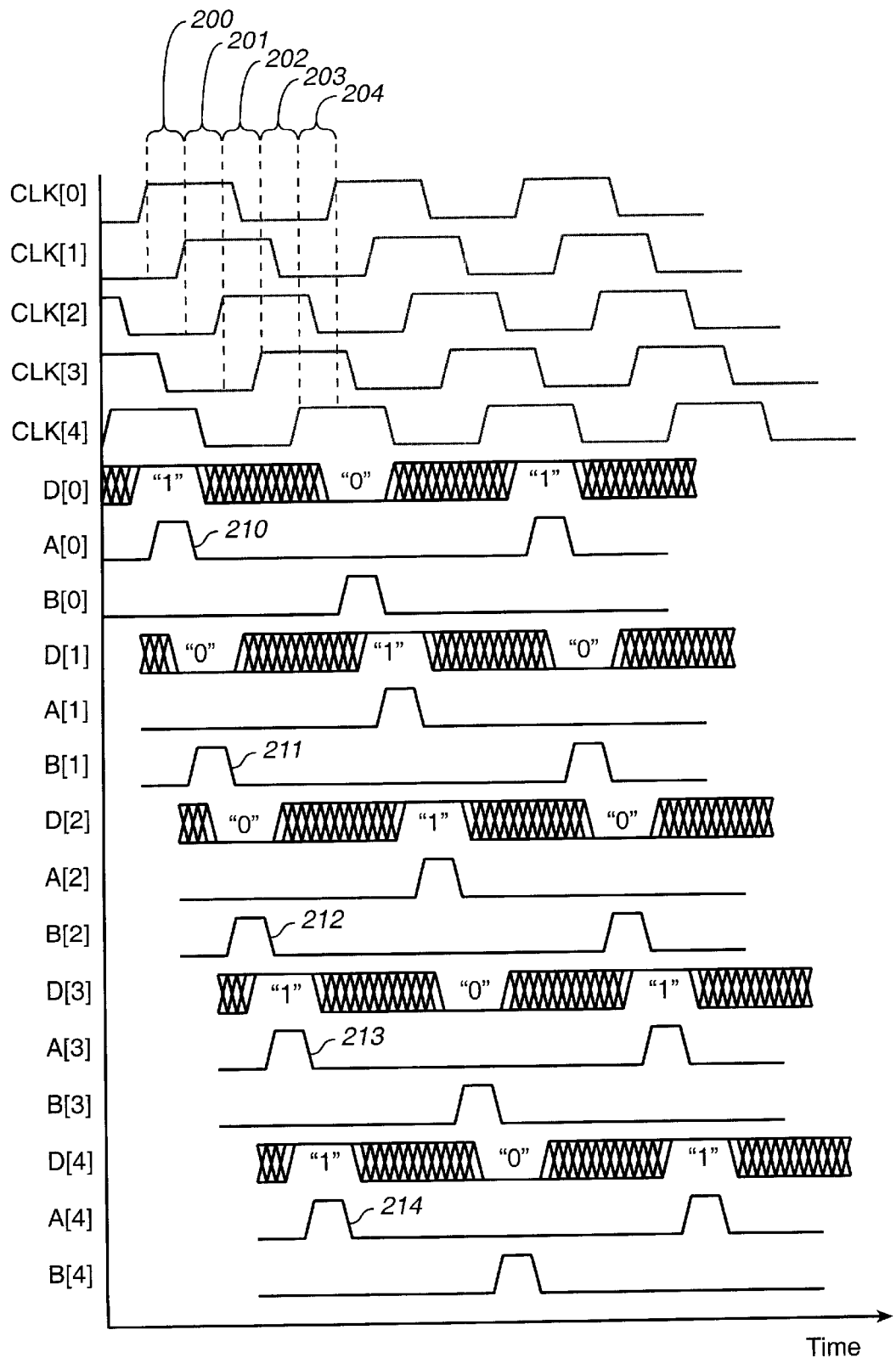
FIG._2

LOW-POWER DATA SERIALIZER

CROSS-REFERENCE TO RELATED APPLICATION

This application claims priority from U.S. Provisional Application No. 60/236,415 filed Sep. 28, 2000, and entitled "LOW-POWER DATA SERIALIZER".

Cross reference is also made to U.S. application Ser, No. 09/783,231, entitled "DATA SERIALIZER WITH SLEW RATE CONTROL", U.S. application Ser. No. 09/782,842, entitled "RESISTIVELY-LOADED CURRENT MODE OUTPUT BUFFER WITH SLEW RATE CONTROL," and U.S. application Ser. No. 09/783,690, entitled "REDUCED-SWING DIFFERENTIAL OUTPUT BUFFER WITH IDLE FUNCTION," which were filed on even date herewith.

BACKGROUND OF THE INVENTION

The present invention relates to high-speed serial data transceivers and, in particular, high-speed data serializers.

Serial data communication circuits use data serializers for converting a plurality of parallel data inputs to a single serial data stream. A typical data serializer includes a time-division data multiplexer, which sequentially multiplexes the parallel data outputs to a single output. The sequential selection of data inputs is controlled by a clock circuit which has two or more phases. A typical multi-phase clock circuit generates n select clock signals. The n select clock signals are equally distributed in phase over 360 degrees. The select clock signals are used to select individual data inputs in a particular order.

SUMMARY OF THE INVENTION

A data serializer according to one embodiment of the present invention includes a differential output stage. The differential output stage has n pairs of first and second control inputs, wherein each pair of control inputs corresponds to one of n parallel data inputs. Each pair of first and second control inputs is driven by first and second logic AND circuits having only p-channel output drive transistors.

One aspect of the present invention is directed to a data serializer, which includes n data inputs, n clock inputs, a differential output stage and an input stage. Each clock input is out of phase with the other clock inputs and corresponds to one of the n data inputs. The differential output stage has first and second differential data outputs and n pairs of first and second control inputs, wherein each pair of control inputs corresponds to one of the n data inputs. The input stage includes, for each of the n data inputs, a first logic AND circuit and a second logic AND circuit. The first logic AND circuit has first, second and third inputs which are coupled to the data input, the corresponding clock input and an inverse of the clock input that next trails the corresponding clock input in phase, respectively, and an output which is coupled to the first control input of the corresponding pair of control inputs through p-channel drive transistors. The second logic AND gate circuit has first, second and third inputs which are coupled to an inverse of the data input, the corresponding clock input and the inverse of the clock input that next trails the corresponding clock input in phase, respectively, and an output which is coupled to the second control input of the corresponding pair of control inputs through p-channel drive transistors.

Another aspect of the present invention is directed to a method of serializing a parallel data input having n data inputs. The method includes providing n differential transistor pairs in parallel with one another, between first and second differential data outputs and a tail current source. Each transistor pair has a respective pair of first and second control inputs. The method further includes receiving the n data inputs and n clock signals, wherein each clock signal is out of phase with the other clock signals and corresponds to one of the n data inputs. For each of the n data inputs received, the respective pair of first and second control inputs is driven between first and second voltage levels using p-channel driving transistors based on logic states of the corresponding data input, the corresponding clock signal and the clock signal that next trails the corresponding clock signal in phase.

BRIEF DESCRIPTION OF THE DRAWINGS

FIG. 1 is a schematic diagram of a data serializer according to one embodiment of the present invention.

FIG. 2 is a timing diagram, which shows clock inputs, data inputs and intermediate pulsed output signals of the data serializer shown in FIG. 1 over time.

FIG. 3 is a timing diagram which illustrates the intermediate pulsed output signals and a final differential data output over time.

DETAILED DESCRIPTION OF ILLUSTRATIVE EMBODIMENTS

FIG. 1 is a schematic diagram of a data serializer according to one embodiment of the present invention. Data serializer 100 is configured as a 5:1 data serializer. However, data serializer 100 can be configured as any n:1 data serializer in alternative embodiments, where n is integer greater than one, FIG. 1 and the following description describe the case of n=5. All bold circuit elements and buses in FIG. 1 depict "arrays" of five devices or nets. Where a bus connects to an array of circuit elements, each net in the bus connects to one element in the array. Where a single, non-bolded net is connected to a pin in an array of circuit elements, this indicates that this pin on each circuit element in the array is connected to the same pin in the other elements in the array and also to this net.

Data serializer 100 has an output stage 102 and an input stage 104. Output stage 102 includes tail current source 106, an array of differential n-channel transistor pairs M1A[0:4] and M1B[0:4], differential data outputs TXP and TXN and load resistors RA and RB. Tail current source 106 generates a tail current ITAIL and is coupled between the sources of transistors M1A[0:4] and M1B[0:4] and voltage supply terminal VSS (e.g., ground). The drains of each transistor M1A[0:4] are coupled to data output TXN, and the drains of transistors M1B[0:4] are coupled to data output TXP. Differential data outputs TXP and TXN are coupled to termination voltage supply terminal VTERM through load resistors RA and RB, respectively. Load resistors RA and RB may be on-chip or off-chip, and there may be additional resistive loads (not shown) in parallel with RA and RB.

Each differential transistor pair M1A[0:4] and M1B[0:4] steers the tail current ITAIL through one side of the output stage or the other, depending on the relative voltages on the gates of each transistor in the pair. Thus, one of the differential outputs TXP and TXN will be pulled low by tail current source 106, and the other will be pulled high through the respective load resistor RA or RB. The gates of transistors M1A[0:4] are coupled to respective nets in bus A[0:4], and the gates of transistors M1B[0:4] are coupled to respective nets in bus B[0:4]. As described in more detail below, input stage 104 drives only one of the transistors M1A[0:4]

and M1B[0:4] to an on state at one time, through buses A[0:4] and B[0:4].

Input stage 104 has parallel data inputs D[0:4], inverted data inputs $\overline{D[0:4]}$, corresponding clock inputs CLK[0:4], inverted clock inputs $\overline{CLK[0:4]}$ and first and second logic AND circuits 110A and 110B. Each clock input CLK[0:4] is out of phase with the other clock inputs CLK[0:4]. In one embodiment, the phases of clock inputs CLK[0:4] are evenly distributed over 360 degrees.

Logic AND circuit 110A includes arrays of p-channel drive transistors M2A[0:4], M3A[0:4], M4A[0:4] and M5A[0:4] and NAND gates 114A[0:4]. Drive transistors M2A[0:4] and NAND gates 114A[0:4] together form respective pull-up AND gates 116A[0:4], which drive bus A[0:4] between only two logic states, a logic high state and a high impedance state, depending on the logic states of CLK[0:4], $\overline{CLK[1:4,0]}$ and D[0:4].

Each of the transistors M2A[0:4] is coupled between a respective net in bus A[0:4] and voltage supply terminal VDD. The gate of each transistor M2A[0:4] is coupled to the output of a respective NAND gate 114A[0:4]. Each NAND gate 114A[0:4] has a first input coupled to a respective clock input CLK[0:4], a second input coupled to a respective inverted clock input $\overline{CLK[1:4,0]}$ and a third input coupled to a respective data input D[0:4]. With this circuit configuration, each pull-up AND gate 116A[n] pulls the respective net A[n] high toward the voltage on voltage supply terminal VDD when all of the inputs D[n], CLK[n] and $\overline{CLK[n+1]}$ are high. When any of the inputs D[n], CLK[n] and $\overline{CLK[n+1]}$ are low, pull-up AND gate 116A[n] is seen as a high impedance to the respective net A[n].

Drive transistors M3A[0:4], M4A[0:4] and M5A[0:4] together form respective pull-down AND gates 118A[0:4], which drive bus A[0:4] between only two logic states, a logic low state and a high impedance state, depending on the logic states of clock inputs CLK[0:4], inverted clock inputs $\overline{CLK[1:4,0]}$ and data inputs D[0:4]. Each transistor M3A[0:4], M4A[0:4] and M5A[0:4] is coupled between a respective net in bus A[0:4] and voltage supply terminal VPDLO. The gate of each transistor M3A[0:4] is coupled to a respective data input D[0:4]. The gate of each transistor M4A[0:4] is coupled to a respective clock input CLK[0:4]. The gate of each transistor M5A[0:4] is coupled to a respective inverted clock input $\overline{CLK[1:4,0]}$. Each pull-down AND gate 118A[n] pulls the respective net A[n] low toward the voltage on voltage supply terminal VPDLO when any of the inputs D[n], CLK[n] and $\overline{CLK[n+1]}$ are low. When all of the inputs D[n], CLK[n] and $\overline{CLK[n+1]}$ are high, the output of AND gate 118A[n] is a high impedance.

Similarly, logic AND circuit 110B includes arrays of p-channel drive transistors M2B[0:4], M3B[0:4], M4B[0:4] and M5B[0:4] and NAND gates 114B[0:4]. Drive transistors M2B[0:4] and NAND gates 114B[0:4] together form respective pull-up AND gates 116B[0:4], which drive bus B[0:4] between only two logic states, a logic high state and a high impedance state, depending on the logic states of clock inputs CLK[0:4], inverted clock inputs $\overline{CLK[1:4,0]}$ and inverted data inputs $\overline{D[0:4]}$.

Each of the transistors M2B[0:4] is coupled between a respective net in bus B[0:4] and voltage supply terminal VDD. The gate of each transistor M2B[0:4] is coupled to the output of a respective NAND gate 114B[0:4]. Each NAND gate 114B[0:4] has a first input coupled to a respective clock input CLK[0:4], a second input coupled to a respective clock input $\overline{CLK[1:4,0]}$ and a third input coupled to a respective inverted data input $\overline{D[0:4]}$. With this circuit configuration, each pull-up AND gate 116B[n] pulls the respective net B[n] high toward the voltage on voltage supply terminal VDD when all of the inputs $\overline{D[n]}$, CLK[n] and $\overline{CLK[n+1]}$ are high. When any of the inputs $\overline{D[n]}$, CLK[n] and $\overline{CLK[n+1]}$ are low, pull-up AND gate 116B[n] is seen as a high impedance to the respective net B[n].

Drive transistors M3B[0:4], M4B[0:4] and M5B[0:4] together form respective pull-down AND gates 118B[0:4], which drive bus B[0:4] between only two logic states, a logic low state and a high impedance state, depending on the logic states of clock inputs CLK[0:4], inverted clock inputs $\overline{CLK[1:4,0]}$ and inverted data inputs $\overline{D[0:4]}$. Each transistor M3B[0:4], M4B[0:4] and M5B[0:4] is coupled between a respective net in bus B[0:4] and voltage supply terminal VPDLO. The gate of each transistor M3B[0:4] is coupled to a respective inverted data input $\overline{D[0:4]}$. The gate of each transistor M4B[0:4] is coupled to a respective clock input CLK[0:4]. The gate of each transistor M5B[0:4] is coupled to a respective inverted clock input $\overline{CLK[1:4,0]}$. Each pull-down AND gate 118B[n] pulls the respective net B[n] low toward the voltage on voltage supply terminal VPDLO when any of the inputs $\overline{D[n]}$, CLK[n] and $\overline{CLK[n+1]}$ are low. When all of the inputs $\overline{D[n]}$, CLK[n] and $\overline{CLK[n+1]}$ are high, the output of AND gate 118B[n] is a high impedance.

For each data input D[0:4] (and inverted data input $\overline{D[0:4]}$), input stage 104 generates a pulse on the respective net in bus A[0:4] or B[0:4]) depending on whether that data bit is high or low. Clock inputs CLK[0:4] (and inverted clock inputs $\overline{CLK[0:4]}$) are used to time-multiplex the data inputs D[0:4] such that only one of nets in both buses A[0:4] and B[0:4] is pulsed high at one time.

For example on the "A" side of input stage 104, if data bit D0 is a "1", NAND gate 114A[0] turns on pull-up transistor M2A[0] to provide a pulse on A[0] only when the corresponding clock signal CLK[0] is high and the next clock signal CLK[1] trailing in phase from CLK[0] is low. When either CLK[0] is low or CLK[1] is high, NAND gate 114A[0] turns off pull-up transistor M2A[0], and one or both of the pull-down transistors M4A[0] or M5A[0] pulls net A[0] low.

On the "B" side of input stage 104 during the time interval in which CLK[0] is high and CLK[1] is low, NAND gate 114B[0] turns off pull-up transistor M2B[0], and pull-down transistor M3B[0] is on, which pulls net B[0] low toward VPDLO. Thus, transistor M1A[0] receives a pulse, and transistor M1B[0] receives no pulse. Transistor M1A[0] turns on, pulling data output TXN low toward VSS. Transistor M1B[0] remains off, and data output TXP is pulled high through load resistor RA. The result is a positive pulse on differential data outputs TXP and TXN (TXP-TXN).

FIG. 2 is a timing diagram which shows clock signals CLK[0]–CLK[4], data signals D[0]–D[4], and intermediate pulsed output signals A[0]–A[4] and B[0]–B[4] over time. FIG. 2 shows an example in which data serializer 100 serializes the sequence "100110110010011".

Individual clock signals CLK[0]–CLK[4] are shown at the top of the diagram. Each clock signal is out-of-phase with the other clock signals, and the clock signals are evenly distributed in phase over 360 degrees. In data signals D[0]–D[4], the regions that are not cross-hatched indicate time periods during which that data signal must be valid. Each data signal D[n] needs to be valid only when CLK[n] is high and the next clock signal CLK[n+1] that is next trailing CLK[n] in phase is low.

For example, during time interval 200, clock signal CLK[0] is high, clock signal CLK[1] is low and data signal D[0]

is high. As described with reference to FIG. 1 above, a logic high value on data input D[0] during time interval 200 results in a pulse 210 in intermediate output signal A[0] and no pulse in intermediate output signal B[0].

During time interval 201, clock signal CLK[1] is high and clock signal CLK[2] is low. In this time interval, data signal D[1] is low resulting in no pulse in intermediate output signal A[1] and a pulse 211 in intermediate output signal B[1]. During time interval 202, clock signal CLK[2] is high and clock CLK[3] is low. In this time interval, data signal D[2] is low resulting in no pulse in intermediate output A[2] and a pulse 212 in intermediate output B[2]. During time interval 203, clock signal CLK[3] is high and clock signal CLK[4] is low. In this time interval, data signal D3 is high resulting in a pulse 213 in intermediate output A[3] and no pulse in intermediate output B[3]. During time interval 204, clock signal CLK[4] is high and clock CLK[0] is low. In this time interval, data signal D[4] is high resulting in a pulse 214 in intermediate output A[4] and no pulse in intermediate output B[4]. This process repeats for each subsequent data bit in the sequence being serialized.

FIG. 3 is a timing diagram which illustrates the final stage of serialization. From the timing diagram shown in FIG. 2, the signals A[0]–A[4] and B[0]–B[4] have been copied and superimposed on one another. Given these signals A[0:4] and B[0:4], the output transistors M1A[0:4] and M1B[0:4] function so as to logically "OR" the "A" bus and logically "OR" the "B" bus. That is, if any signal in A[0:4] is high, then TXP-TXN will be high. Likewise, if any signal in B[0:4] is high, then TXP-TXN will be low. As shown in FIG. 3, only one signal in A[0:4] and B[0:4] is high at any give time.

In summary, the data serializer of the present invention is capable of serializing data at a high rate while consuming relatively little power as compared to serializers of the prior art. Referring back to FIG. 1, the only DC current drawn by data serializer 100 is the current drawn by tail current source 106 and load resistors RA and RB. Input stage 104 draws no DC current. Current is drawn by input stage 104 only during the switching of the transistors in input stage 104. This significantly reduces the power consumed by data serializer 100.

Also, only P-channel transistors are used to drive intermediate output buses A[0:4] and B[0:4] high and low. This allows the voltage supplied on VPDLO to be raised above the voltage on VSS to conserve additional power during the switching of output transistors M1A[0:4] and M1B[0:4]. The voltage on VPDLO sets the logic low level for the signals on buses A[0:4] and B[0:4]. The logic high level on these buses is VDD. The voltage on VPDLO is chosen so that the gate-to-source voltage VGS for the "off" transistors in the M1A[0:4] and M1B[0:4] arrays is just slightly less than the gate-to-source threshold voltage $V_{TN}$ for these transistors. With the exception of signals TXP, TXN, A[0:4] and B[0:4], all signals in data serializer 100 swing between power supply rails VSS and VDD.

The appropriate voltage on VPDLO can be delivered to data serializer 100 from off-chip or on-chip. In one embodiment, an on-chip feedback circuit is used to generate the appropriate voltage on VPDLO to ensure that the current in the "off" transistors in the M1A[0:4] and M1B[0:4] arrays is zero or nearly zero. In an alternative embodiment, a programmable on-chip voltage source is included with serializer 100. The voltage level on VPDLO is set by providing an appropriate digital control word to the programmable voltage source. Other methods of setting the voltage on VPDLO can also be used.

Although the present invention has been described with reference to preferred embodiments, workers skilled in the art will recognize that changes may be made in form and detail without departing from the spirit and scope of the invention. For example, the terms "high" and "low" are arbitrary terms that are interchangeable in the specification and claims, and any element can be active high or low, with appropriate inversions. In addition, the term "coupled" used in the specification and the claims can include various types of connections or couplings and can include a direct connection or a connection through one or more intermediate components.

What is claimed is:

1. A data serializer comprising:

n data inputs, where n is an integer greater than one;

n clock inputs, wherein each clock input is out of phase with the other clock inputs and corresponds to one of the n data inputs;

a differential output stage comprising first and second differential data outputs and n pairs of first and second control inputs, wherein each pair of control inputs corresponds to one of the n data inputs; and an input stage comprising, for each of the n data inputs:

a first logic AND circuit having first, second and third inputs which are coupled to the data input, the corresponding clock input and an inverse of the clock input that next trails the corresponding clock input in phase, respectively, and an output which is coupled to the first control input of the corresponding pair of control inputs through p-channel drive transistors; and a second logic AND circuit having first, second and third inputs which are coupled to an inveise of the data input, the corresponding clock input and the inverse of the clock input that next trails the corresponding clock input in phase, respectively, and an output which is coupled to the second control input of the corresponding pair of control inputs through p-channel drive transistors.

2. The data serializer of claim 1 wherein the first and second logic AND circuits each comprises:

a pull-up AND gate having first, second and third inputs and an output which are coupled to the first, second and third inputs and the output of the respective logic AND circuit, wherein the output has only two states, including a logic high state and a high impedance state, depending on the logic states of the respective first, second and third inputs to the pull-up AND gate; and a pull-down AND gate having first, second and third inputs and an output which are coupled to the first, second and third inputs and the output of the respective logic AND circuit, wherein the output has only two states, including a logic low state and a high impedance state, depending on the logic states of the respective first, second and third inputs to the pull-up AND gate.

3. The data serializer of claim 2 wherein each pull-up AND gate comprises:

a logic high voltage supply terminal;

a p-channel pull-up transistor coupled between the corresponding first or second control input of the corresponding pair of control inputs and the logic high voltage supply terminal and having a pull-up control terminal;

a logic NAND gate having first, second and third inputs which are coupled to the first, second and third inputs of the respective logic AND circuit and having an output coupled to the pull-up control terminal.

4. The data serializer of claim 2 wherein each pull-down AND gate comprises:
   a logic low voltage supply terminal; and
   first, second and third p-channel pull-down transistors coupled between the corresponding first or second control input of the corresponding pair of control inputs and the logic low voltage supply terminal and having pull-down control terminals coupled to the first, second and third inputs, respectively, of the respective logic AND circuit.

5. The data serializer of claim 2 wherein the differential output stage further comprises:
   a ground terminal having a voltage;
   a tail current source coupled to the ground terminal; and
   an array of n differential transistor pairs, wherein each transistor pair is coupled between the first and second differential data outputs and the tail current source and comprises a pair of transistor control terminals that forms a corresponding pair of the first and second control inputs to the differential output stage.

6. The data serializer of claim 5 wherein:
   the tail current source has a voltage drop across the tail current source;
   the n differential transistor pairs are n-channel transistor pairs having gate-to-source threshold voltages; and
   the logic low state on the output of the pull-down AND gate is biased at a voltage that is greater than or equal to the voltage on the ground terminal and less than or equal to the sum of the gate-to-source threshold voltage of the n-channel transistor pairs and the voltage drop across the tail current source.

7. The data serializer of claim 1 wherein the differential output stage further comprises:
   a termination voltage supply terminal; and
   first and second load resistors coupled in series between the termination voltage supply terminal and the first and second differential data outputs, respectively.

8. A data serializer comprising:
   first and second voltage supply terminals, which are biased at first and second voltages, respectively;
   n data inputs, where n is an integer greater than zero;
   n clock inputs, wherein each clock input is out of phase with the other clock inputs and corresponds to one of the n data inputs;
   differential output stage means for generating a differential serial data output based on pulses received on n pairs of first and second control inputs, wherein each pair of control inputs corresponds to one of the n data inputs; and
   an input stage comprising, for each of the n data inputs:
      first logic AND means for driving the first control input of the corresponding pair of control inputs between the first and second voltages with only p-channel drive transistors based on logic states of the data input, the corresponding clock input and an inverse of the clock input that next trails the corresponding clock input in phase; and
      second logic AND means for driving the second control input of the corresponding pair of control inputs between the first and second voltages with p-channel drive transistors based on logic states of an inverse of the data input, the corresponding clock input and the inverse of the clock input that next trails the corresponding clock input in phase.

9. The data serializer of claim 8 wherein the first and second logic AND means each comprises:
   a pull-up AND gate having first, second and third inputs, which are coupled to inputs of the respective logic AND means, and an output, which is coupled to the first control input of the corresponding pair of control inputs, wherein the output has only two states, including a logic high state at the first voltage and a high impedance state, depending on the logic states of the first, second and third inputs of the pull-up AND gate; and
   a pull-down AND gate having first, second and third inputs, which are coupled to inputs of the respective logic AND means, and an output, which is coupled to the first control input of the corresponding pair of control inputs, wherein the output has only two states, including a logic low state at the second voltage and a high impedance state, depending on the logic states of the first, second and third inputs of the pull-down AND gate.

10. The data serializer of claim 9 wherein each pull-up AND gate comprises:
    a p-channel pull-up transistor coupled between the first control input of the corresponding pair of control inputs and the first voltage supply terminal and having a pull-up control terminal; and
    a logic NAND gate having first, second and third inputs which are coupled to the first, second and third inputs of the respective pull-up AND gate and having an output coupled to the pull-up control terminal.

11. The data serializer of claim 9 wherein each pull-down AND gate comprises:
    first, second and third p-channel pull-down transistors coupled between the first control input of the corresponding pair of control inputs and the second voltage supply terminal and having pull-down control terminals coupled to the first, second and third inputs, respectively, of the respective pull-down AND gate.

12. The data serializer of claim 9 wherein the differential output stage further comprises:
    a ground terminal, which is biased at a ground voltage that is less than the first voltage and less than or equal to the second voltage;
    a tail current source coupled to the ground terminal; and
    an array of n differential transistor pairs, wherein each transistor pair is coupled between the differential serial data output and the tail current source and comprises a pair of transistor control terminals that forms a corresponding pair of the first and second control inputs to the differential output stage.

13. The data serializer of claim 12 wherein:
    the tail current source has a voltage drop across the tail current source;
    the n differential transistor pairs are n-channel transistor pairs having gate-to-source threshold voltages; and
    the second voltage is greater than or equal to the ground voltage and less than or equal to the sum of the gate-to-source threshold voltage of the n-channel transistor pairs and the voltage drop across the tail current source.

14. The data serializer of claim 8 wherein the differential output stage means comprises:
    a termination voltage supply terminal;
    first and second differential data outputs that form the differential serial data output; and first and second load resistors coupled in series between the termination voltage supply terminal and the first and second differential data outputs, respectively.

15. A method of serializing a parallel data input having n data inputs, the method comprising:
  (a) providing n differential transistor pairs in parallel with one another, between first and second differential data outputs and a tail current source, wherein each transistor pair comprises a respective pair of first and second control inputs;
  (b) receiving the n data inputs;
  (c) receiving n clock signals, wherein each clock signal is out of phase with the other clock signal and corresponds to one of the n data inputs; and
  (d) for each of the n data inputs received in step (b), driving the respective pair of first and second control inputs between first and second voltage levels with p-channel driving transistors based on logic states of the corresponding data input, the corresponding clock signal and the clock signal that next trails the corresponding clock signal in phase.

16. The method of claim 15 wherein step (d) comprises:
  (d)(1) driving the first control input of the respective pair of control inputs between the first and second voltage levels based on a logic AND of the logic states of the corresponding data input, the corresponding clock signal and an inverse of the clock signal that next trails the corresponding clock signal in phase; and
  (d)(2) driving the second control input of the respective pair of control inputs between the first and second voltage levels based on a logic AND of the logic states of an inverse of the data input, the corresponding clock signal and the inverse of the clock signal that next trails the corresponding clock signal in phase.

* * * * *